(12) United States Patent
Haug

(10) Patent No.: US 7,645,951 B2
(45) Date of Patent: Jan. 12, 2010

(54) DEVICE FOR PROTECTING DATA STORED IN A SWITCHING ARRANGEMENT THAT CONSISTS OF ELECTRONIC COMPONENTS AND A PROCESSOR

(75) Inventor: Thomas Haug, Langnau im Emmental (CH)

(73) Assignee: Frama AG, Lauperswil (CH)

( * ) Notice: Subject to any disclaimer, the term of this patent is extended or adjusted under 35 U.S.C. 154(b) by 628 days.

(21) Appl. No.: 11/316,230

(22) Filed: Dec. 22, 2005

(65) Prior Publication Data

US 2007/0198860 A1  Aug. 23, 2007

(30) Foreign Application Priority Data

Dec. 22, 2004  (EP) .................................. 04405799

(51) Int. Cl.
*H01H 13/00* (2006.01)
*H01H 15/00* (2006.01)

(52) U.S. Cl. ..................................... 200/16 A; 200/600
(58) Field of Classification Search ................ 200/16 A
See application file for complete search history.

(56) References Cited

U.S. PATENT DOCUMENTS 5,027,397 A  6/1991  Double et al.
5,353,350 A  10/1994  Unsworth et al.
7,180,017 B2 *  2/2007  Hein .......................... 200/5 R
2002/0002683 A1  1/2002  Benson et al.
2005/0274597 A1 *  12/2005  Lee et al. ..................... 200/600
2008/0202912 A1 *  8/2008  Boddie et al. ................ 200/600

FOREIGN PATENT DOCUMENTS

EP  1 054 316  11/2000
EP  1 273 997  1/2003
GB  2 275 914  9/1994

* cited by examiner

*Primary Examiner*—Michael A Friedhofer
*Assistant Examiner*—Lheiren Mae A Anglo
(74) *Attorney, Agent, or Firm*—Friedrich Kueffner

(57) ABSTRACT

A device for protecting data for operating or controlling functions of an operating system, process, equipment, and/or a machine, which is stored in a switching arrangement that consists of electronic components and a processor, wherein the switching arrangement is mounted on a printed circuit board inside a housing or is embedded by an insulating material. A pickup or sensor, which is electrically conductively connected with the switching arrangement, is arranged along the walls on the inside of the housing, is embedded in the walls of the housing, or is arranged inside the insulating material.

18 Claims, 2 Drawing Sheets

DEVICE FOR PROTECTING DATA STORED IN A SWITCHING ARRANGEMENT THAT CONSISTS OF ELECTRONIC COMPONENTS AND A PROCESSOR

BACKGROUND OF THE INVENTION

1. Field of the Invention

The present invention relates to a device for protecting data for operating or controlling functions of an operating system, process, equipment, and/or a machine, which is stored in a switching arrangement that consists of electronic components and/or a processor, wherein the switching arrangement is mounted on a circuit board inside a housing or is embedded in a plastic.

2. Description of the Related Art

In every organization, not only the internet but in general all handling of electronic data and information, which represents an important part of business secrets, requires secure storage and transmission of data. In this regard, various risk management strategies are based, for example, on the use of cryptographic methods in order to be able to guarantee the protection, security, and availability of data for controlling operating systems, equipment, and/or machines and to be able to enter and retrieve critical technical, business, or legal results in rapid succession.

In the past, application developers had little interest in the incorporation of security functions in their products, because there was a lack of demand, and the incorporation of security functions would have appreciably increased the price of the products.

An important security measure is cryptography, which engineers incorporate in newly developed products and which reliably protects the products with respect to use and misuse. Cryptographic methods or encryption by characters and numbers or well-defined algorithms are also used in data banks, which control the protection and traffic of confidential information. Personal data also needs to be protected, which is certainly not the least important aspect of self-protection.

To protect secrets from misuse or unauthorized access, repeatedly acting protective measures are introduced in computer operating systems. An attack on encrypted data is often made by a decryption operation, in which the attacker attempts, for example, to determine the code or break the algorithm. If an attack is successful, then the attacker can use the compromised and still valid code and can cause great damage without being detected.

One countermeasure to this type of procedure is an electromechanical housing lock, which, when the housing is opened, causes the operating system of a device or at least the security-relevant data of the electronic components of a switching arrangement to be immediately erased. The lock consists, for example, of an electromechanical switch which, on the one hand, is mounted on a printed circuit board, circuit card, or the like and, on the other hand, is connected with the housing. However, this security principle is unsuitable if an attack on the operating data is planned which does not involve opening a housing that comprises several housing sections, for example, by drilling an access hole into the housing. Therefore, more extensive security precautions are demanded for the protection of electronically stored operating data.

Protective sensors were previously wound around the outside of a housing. This has the disadvantage that the sensors have connections, which are led out from the inside and thus convey high-frequency signals. Filter measures are necessary, but these cannot totally eliminate the security risk.

WO 99/48055 describes, among other things, a "tamper-resistant postal security device" with a housing for protecting data carriers that contain electronic components for storing and generating print data for printed postal indicia.

SUMMARY OF THE INVENTION

The object of the present invention is to create a device of the aforementioned type, with which an attack on stored operating data can be prevented by a protective housing.

In accordance with the invention, this object is met by arranging a pickup or sensor, which is conductively connected electrically with the switching arrangement, along the walls on the inside of the housing, embedding it in the walls of the housing, or arranging it inside the insulating material. In this way, the electronic components or the switching arrangement on the printed circuit board are completely surrounded by a protective covering or shielded and protected towards the outside, so that if an attempt is made to tamper with the housing, for example, by an unauthorized individual, successful access to data stored inside the housing in an electronic switching arrangement can be ruled out.

Pickups or sensors generate electrical signals in control engineering, monitoring, and security of plants and systems, in which deviations from preset reference values are to be detected and converted to control and/or regulating signals. Pickups and sensors are elements whose properties are affected by electrical quantities, e.g., an electric current, or nonelectrical quantities, e.g., a force. They convert, for example, electrical, mechanical, thermal, optical, and chemical quantities into suitable electrical signals. Furthermore, the proposed device is intended to be able both to erase stored data and, alternatively, to initiate erasing.

To protect the switching arrangement, instead of using a housing, it is also possible to use an insulating material to hold a pickup or sensor. For example, the pickup or sensor, connected with the switching arrangement, can be cast in a mold surrounding it with a suitable insulating material, for example, a plastic such as epoxy resin. It is also possible to use a reusable mold for this purpose.

In accordance with a special embodiment, an electrical conductive strip is mounted as a sensor on at least one inside wall of the housing and provides more or less tight shielding of the components located inside the housing.

The conductive strip could also be arranged in the housing walls by inserting it in a casting mold or injection mold before the production of the housing. It is advantageous to arrange the preferably flexible conductive strip between the switching arrangement and an electric power source, for example, a battery or transformer, so that in the event of a current interruption, the data or at least a portion of the data electronically stored in the switching arrangement is erased, or erasing is initiated.

The conductive strip preferably consists of a plurality of connected strip sections that are distributed in at least one plane and run side by side and/or in a coiled arrangement, with the distances between the strip sections being kept minimal, so that a thin drilling tool is sufficient to cause an interruption of the conductive strip and to erase stored data. A substrate joined with the conductive strip is suitable for mounting the conductive strip. The substrate can be applied to the inside walls of the housing or can be joined with them to cover their surface, and the housing can be designed with multiple sections and/or can be designed closed. In the casting of the switching arrangement, a mold that can be used for this purpose could be used as the substrate of the conductive strip, and the mold could form a protective covering of the conductive strip.

A rigid, flexible, or pliable substrate, which can be closely joined with the inside walls of the housing and also covers the transitions of the inside walls, has been found to be a simple solution.

The substrate may be, for example, a foil that is attached to the inside walls of the housing, for example, by means of an adhesive. The conductive strip or foil can be multisectional and can be easily placed over or applied to the inside walls.

In this regard, the conductive strip can be printed or injected on a foil and then covered with a protective layer.

It is advantageous to arrange the conductive strip within a plastic, e.g., a synthetic resin, which can be processed into a foil. This gives rise to several possibilities for the application and arrangement of the conductive strip on the inside walls of the housing.

In this connection, the conductive strip can be fabricated according to the surface of the inside walls of the housing and then adhesively bonded to the inside walls or joined with them over the entire surface.

The conductive strip may also be inserted between injected or otherwise applied layers of plastic, and a protective or insulating layer that adheres to the inside walls of the housing is applied between the inside wall of the housing and the conductive strip. Naturally, the inside wall of the housing can be provided with a different layered structure that meets the requirements for an insulating type of mounting.

It is advantageous for the housing to be made of a ferromagnetic material that significantly limits an effect of external magnetic or electric fields on the electronic components or an effect of components towards the outside.

It is also advantageous for the conductive strip and the components of the switching arrangement to be connected in series or in parallel with the electric power source.

Contacts mounted on the printed circuit board are preferably provided for joining the conductive strip with the electronic components and the processor of the switching arrangement.

If the attack on operating data of the switching arrangement is aimed at the seal of a multisectional housing, in which the printed circuit board with the switching arrangement is mounted on one section of the housing, a mechanical or electromechanical switch is mounted on the printed circuit board and can be actuated by a switching element on the other section of the housing.

Devices of the type proposed here are suitable for data protection especially in automated tellers, postal indicia machines, franking machines, operating systems, systems for electronic data transfer, etc.

Alternatively, in a device of the type proposed here, the board, especially a printed circuit board, that contains the components can also be designed as a pickup or sensor.

In this regard, the board can have a conductive strip with the recommended technical features, and the board can be designed to be flexible, for example, it can be designed as a foil.

The various features of novelty, which characterize the invention, are pointed out with particularity in the claims annexed to and forming part of the disclosure. For a better understanding of the invention, its operating advantages, and specific objects attained by its use, reference should be had to the drawing and descriptive matter in which there are illustrated and described preferred embodiments of the invention.

DETAILED DESCRIPTION OF THE INVENTION

Figure 1:
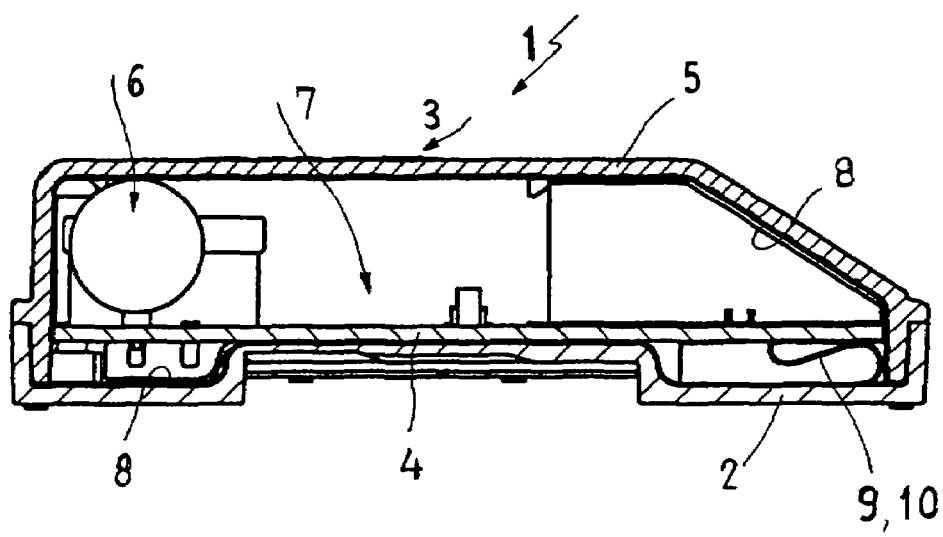
FIG. 1 is a cross section of a device of the invention.

FIG. 1 shows a device 1 for protecting data stored in a switching arrangement 7 (partially visible) that consists of electronic components 6 and at least one processor or microcontroller for protecting operating data for operating or controlling functions of an operating system, process, equipment, and/or a machine.

This device 1 has a closed housing 3 with a housing section 2, on which a printed circuit board 4 of the electronic switching arrangement 7 is detachably mounted.

The inside walls of the housing 3 or of the housing sections 2 and 5 are covered with a conductive strip 8, which is conductively connected with the switching arrangement 7. In the present case, housing section 5 is provided as a cover for the switching arrangement 7, which is detachably mounted in housing section 2.

Figure 2:
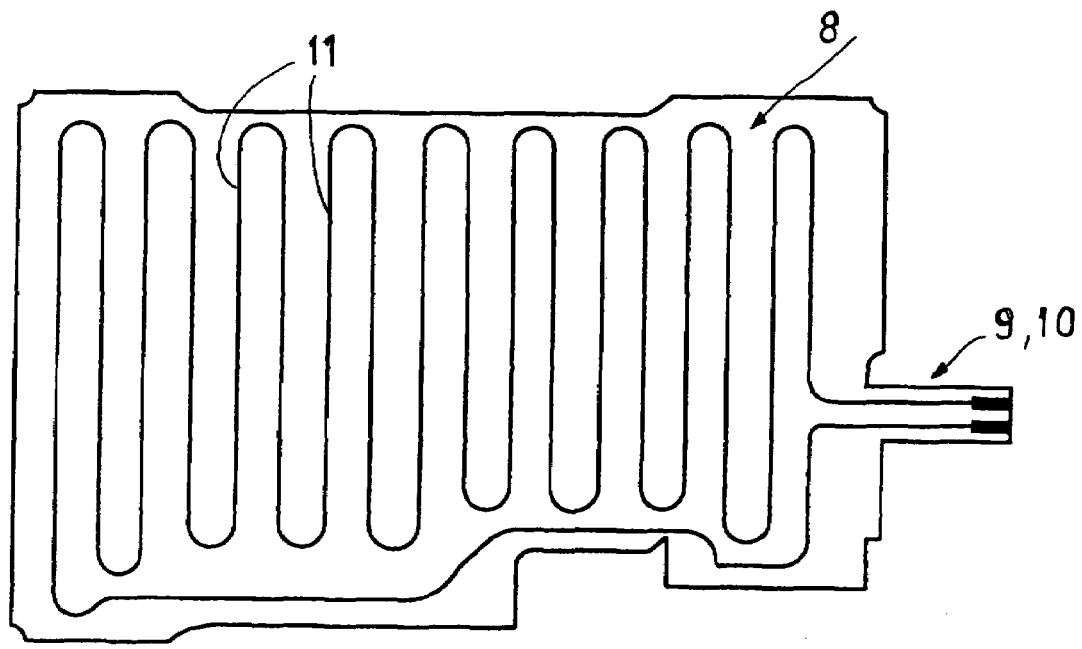
FIG. 2 shows a fabricated conductive strip protected by a foil.
Figure 3:
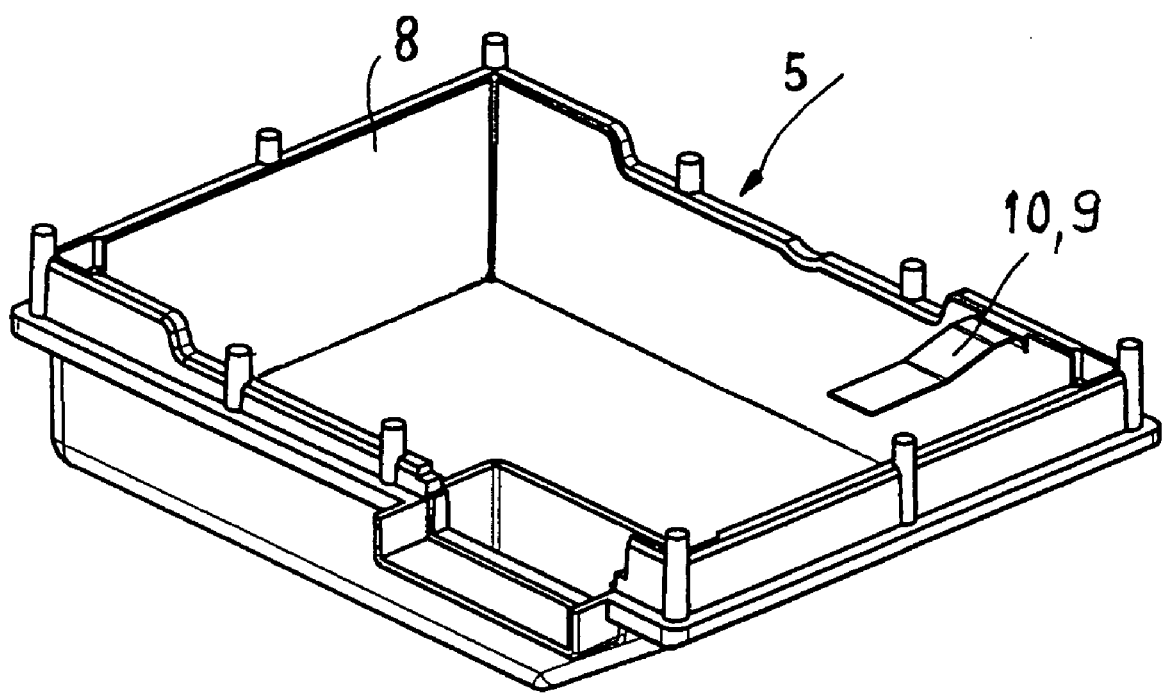
FIG. 3 is a perspective view of a section of a multisectional housing of the device.

The conductive strip 8 is connected with the switching arrangement 7, which consists of electronic components 6 and a processor, and with a power supply or low-voltage electric power source, e.g., a battery. In the illustrated embodiment, the inside walls of the housing sections 2, 5, which can be separated from each other, are each provided with a foil-like conductive strip 8. Each conductive strip 8 is conductively connected with the components 6 of the switching arrangement 7. As shown in FIGS. 1 to 3, the connection is made by contact tabs 9, 10, which have a circuit section connected with the conductive strip 8. The circuit section connects the switching arrangement 7 with the conductive strip 8 by a contact (not visible). The conductive strip 8 consists, for example, of a plurality of conductively connected strip sections 11, which are laid in several planes and run side by side, as shown spread out in FIG. 2. These conductively connected strip sections 11 run side by side or with an at least partially coiled arrangement small distances apart to cover the surface, so that a breach of the housing 3 causes damage that results in an interruption of the conductive strip 8.

The conductive strip 8 shown in FIG. 2 is fabricated according to the surface of the inside walls of the housing and can be laid without gaps on the inside walls due to its flexible or pliable construction. Naturally, individual, electrically interconnected elements of the conductive strip 8 can also be mounted on the inside walls of the housing 3 or housing sections 2, 5. Elements of this type could be arranged with overlapping at the edges to avoid gaps.

The laying or mounting of the conductive strip 8 or of elements of the conductive strip could be accomplished by adhesive bonding, welding, or casting. In an alternative embodiment for placing the conductive strip(s) over the inside walls of the housing 3 or mounting them on the inside walls, layers are applied, between which the conductive strip(s) are arranged, for example, by injection or casting, such that a first layer applied to the inside wall serves as insulation for the conductive strip 8 from the metallic housing 3 and as a substrate for the conductive strip 8, and a protective layer is applied over it. Naturally, A different layered structure can be used in the production and arrangement of the conductive strip.

To protect against magnetic and/or electric fields, the material for the housing 3 can be an electrically conductive material, for example, a ferromagnetic material.

The conductive strip 8 is connected with the switching arrangement 7 via a contact tab 9, 10 by means of contact with the switching arrangement 7 or the printed circuit board 4. To ensure comprehensive protection of the switching arrangement 7, which is formed in a housing 3 that comprises a housing section 2 designed for mounting the printed circuit board 4 of the switching arrangement 7 and a housing section 5 that covers the electronic components 6, a switch (not shown) is present on the printed circuit board 4. This switch can be electromechanically actuated and is electrically connected with the switching arrangement 7. The switch is actuated by a switching element 12 that is mounted on one housing section 2, 5.

In the illustrated embodiment, the switching element 12 (see FIG. 1) is mounted on the housing section 2 that holds the printed circuit board 4. The housing section 5, which is shown in FIGS. 1 and 3 as a hood-like cover, is placed over the printed circuit board 4 or switching arrangement 7, which contains electronic components 6 and a processor, and is securely connected or interlocked with housing section 5 to form a housing 3 that is closed all around.

The housing 3 or the housing sections 2, 5 are especially injection-molded parts or cast parts and are preferably made of metal.

The housing 3 has an access port or opening, through which the switching arrangement 7 can be connected to an external data site.

While specific embodiments of the invention have been shown and described in detail to illustrate the inventive principles, it will be understood that the invention may be embodied otherwise without departing from such principles.

What is claimed is:

1. A device for protecting data for operating or controlling functions of an operating system, process, equipment, and/or a machine, which is stored in a switching arrangement that includes electronic components and a processor, wherein the switching arrangement is mounted on a printed circuit board inside a housing or is embedded by an insulating material, the device comprising a pickup or sensor electrically conductively connected with the switching arrangement, the pickup or sensor being arranged along the walls on the inside of the housing, or embedded in the walls of the housing, or arranged inside the insulating material, further comprising a conductive strip connected with the switching arrangement, the conductive strip being arranged along the inside walls of the housing, or being embedded in the walls of the housing, or being arranged inside the insulating material, wherein the conductive strip is arranged between the switching arrangement of the components and an electric power source.

2. The device in accordance with claim 1, wherein the conductive strip is mounted on a substrate.

3. The device in accordance with claim 2, wherein substrate is rigid, flexible, or pliable.

4. The device in accordance with claim 3, wherein the substrate is a foil.

5. The device in accordance with claim 2, wherein the conductive strip is printed or injected on a foil strip and covered with a protective layer.

6. The device in accordance with claim 1, wherein the conductive strip is arranged within a plastic which is processed into a foil.

7. The device in accordance with claim 1, with a closed housing that comprises at least two housing sections, wherein the conductive strip is fabricated according to the surface of the inside walls of the housing or the housing sections.

8. The device in accordance with claim 1, wherein the conductive strip is mounted on an inside walls of the housing by adhesive bonding.

9. The device in accordance with claim 1, wherein the conductive strip is mounted by applying layers to the inside walls of the housing.

10. The device in accordance with claim 1, wherein the housing is made of an electrically conductive material.

11. The device in accordance with claim 10, wherein the electrically conductive material is at least partial ferromagnetic material.

12. The device in accordance with claim 1, wherein the components of the switching arrangement and the conductive strip are connected in series.

13. The device in accordance with claim 1, wherein the components of the switching arrangement and the conductive strip are connected in parallel.

14. The device in accordance with claim 1, wherein the conductive strip is connected with the components of the switching arrangement.

15. The device in accordance with claim 14, wherein the printed circuit board has a conductive strip.

16. The device in accordance with claim 1, with a housing that comprises a housing section for mounting the printed circuit board of the switching arrangement and another housing section, further comprising a switch that can be actuated mechanically or electromechanically is mounted on the printed circuit board, and a switching element is mounted on the other housing section.

17. The device in accordance with claim 1, wherein the printed circuit board is a pickup or sensor.

18. A device for protecting data for operating or controlling functions of an operating system, process, equipment, and/or a machine, which is stored in a switching arrangement that includes electronic components and a processor, wherein the switching arrangement is mounted on a printed circuit board inside a housing or is embedded by an insulating material, the device comprising a pickup or sensor electrically conductively connected with the switching arrangement, the pickup or sensor being arranged along the walls on the inside of the housing, or embedded in the walls of the housing, or arranged inside the insulating material, further comprising a conductive strip connected with the switching arrangement, the conductive strip being arranged along the inside walls of the housing, or being embedded in the walls of the housing, or being arranged inside the insulating material, wherein the conductive strip consists of a plurality of conductively connected strip sections that run side by side and/or in a coiled arrangement in at least one plane.

* * * * *